United States Patent
Chung et al.

(10) Patent No.: US 7,527,921 B2
(45) Date of Patent: May 5, 2009

(54) METHOD OF TREATING AND REMOVING A PHOTORESIST PATTERN AND METHOD OF MANUFACTURING A SEMICONDUCTOR DEVICE USING THE SAME

(75) Inventors: Dae-Hyuk Chung, Seongnam-si (KR); Dae-Keun Kang, Incheon (KR); Se-Ho Cha, Goyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 308 days.

(21) Appl. No.: 11/475,154

(22) Filed: Jun. 27, 2006

(65) Prior Publication Data

US 2006/0292491 A1    Dec. 28, 2006

(30) Foreign Application Priority Data

Jun. 28, 2005    (KR) .................... 10-2005-0056082

(51) Int. Cl.
*G03C 5/18*    (2006.01)
*G03C 5/26*    (2006.01)
*B08B 3/00*    (2006.01)

(52) U.S. Cl. .................... 430/449; 430/270.1; 134/201

(58) Field of Classification Search .............. 430/270.1, 430/449; 134/201
See application file for complete search history.

(56) References Cited

FOREIGN PATENT DOCUMENTS

| JP | 2002-231696 | 8/2002 |
|---|---|---|
| JP | 2002-316107 | 10/2002 |
| JP | 2004-071966 | 3/2004 |
| KR | 1020050001797 | 7/2005 |

OTHER PUBLICATIONS

Korean Office Action dated Aug. 31, 2006.

*Primary Examiner*—Geraldina Visconti
(74) *Attorney, Agent, or Firm*—Harness, Dickey & Pierce, P.L.C.

(57) ABSTRACT

Example embodiments of the present invention relate to methods of treating and removing a photoresist pattern and a method of manufacturing a semiconductor device using the same. Other example embodiments of the present invention relate to a method of treating a photoresist pattern and a method of removing a photoresist pattern formed using a photoresist composition suitable for argon fluoride (ArF). In a method of removing a photoresist pattern, an ozone vapor including a water vapor and an ozone gas may be provided onto the photoresist pattern to remove a hydrophobic group from a photoresist resin included in the photoresist pattern. A cleaning solution may be provided to make the photoresist pattern water-soluble. A cleaning process may be performed on the photoresist pattern to remove the photoresist pattern. The photoresist pattern may be effectively removed without an increased processing time and/or damage to a substrate.

15 Claims, 12 Drawing Sheets

US 7,527,921 B2

METHOD OF TREATING AND REMOVING A PHOTORESIST PATTERN AND METHOD OF MANUFACTURING A SEMICONDUCTOR DEVICE USING THE SAME

PRIORITY STATEMENT

This application claims priority under 35 USC § 119 to Korean Patent Application No. 2005-56082 filed on Jun. 28, 2005, in the Korean Intellectual Property Office (KIPO), the entire contents of which are herein incorporated by reference.

BACKGROUND

1. Field

Example embodiments of the present invention relate to methods of treating and removing a photoresist pattern and a method of manufacturing a semiconductor device using the same. Other example embodiments of the present invention relate to a method of treating a photoresist pattern and a method of removing a photoresist pattern formed using a photoresist composition suitable for argon fluoride (ArF).

2. Description of the Related Art

A photoresist pattern may be used in a photolithography process for patterning a substrate in a semiconductor device. The photoresist pattern is a material for forming a film whose solubility changes with an irradiation of light and/or a laser beam. The integrated degree of a semiconductor device may be improved as the resolution of the photoresist pattern and the light source are improved. Resolution of the light source may also be improved by shortening the wavelength of the light source. As the light source with a shortened wavelength is developed, the photoresist pattern suitable for the light source may also be developed. Examples of the photoresist pattern include I-line (365 nm) photoresist, KrF (248 nm) photoresist, ArF (193 nm) photoresist, and/or any other suitable photoresist.

A photolithography process using a KrF light source may have improved resolution and a depth of focus relative to an I-line light source. A photolithography process using a KrF light source may not, however, be effective in controlling a process due to the optical and chemical characteristics. When a chemically amplification type photoresist composition is used, a photoresist pattern may be formed by the catalysis of acid generated in a light-exposure process, unlike dissolution inhibition type photoresists used in a photolithography process using an I-line light source. When loss of acid is generated by base existing in the atmosphere or substrate, the pattern formed using the photoresist may be deteriorated.

A photolithography process using an ArF light source has been developed. For a photolithography process using the ArF light source, a photoresist composition suitable for ArF may be required. The photoresist composition for ArF may be a chemically amplified type photoresist like the photoresist for KrF. The photoresist for ArF may not include a polymer having an unsaturated bond (e.g., a benzene ring), unlike the photoresist for KrF. A polymer having a benzene ring may be used for the I-line photoresist and KrF photoresist, in order to guarantee resistance in a dry-etching process. If the benzene ring is used in the photoresist polymer for ArF, the benzene ring may absorb light having a wavelength of about 193 nm so that transparency of the photoresist is deteriorated and a lower portion of the photoresist may not be exposed to light. A photoresist having a polymer for ArF which includes a carbon-carbon single bond may be developed.

After the photoresist for ArF is used as an etching mask in an etching process, the photoresist for ArF may be removed by an ashing process using an oxygen plasma and/or an ozone gas. When the ashing process is performed using the ozone gas, damage to the substrate may be reduced relative to using the oxygen plasma. The photoresist pattern for ArF may be used for forming a semiconductor device having a line width of less than about 100 nm, but the photoresist pattern for ArF may not be removed well in the ashing process using the ozone gas.

In the ashing process using the ozone gas, the photoresist resin may be oxidized to be soluble in water, and then, removed. The photoresist for KrF may include an unsaturated bond (e.g., a benzene ring) so that the photoresist for KrF may be oxidized. The photoresist for ArF may include only a saturated bond (e.g., a carbon-carbon single bond) so that the photoresist for ArF may not be oxidized or removed using the ozone gas. In a conventional method of removing the photoresist, a carbon-carbon single bond in the photoresist resin may be cut off using the excimer light source to form a carbon-carbon double bond. The photoresist having the carbon-carbon double bond may be oxidized by the ozone gas. In the above method, an additional apparatus equipped with the excimer light source and extra processes may be required and problems (e.g., extension of the processing time and requiring an additional apparatus) may occur.

SUMMARY

Example embodiments of the present invention relate to methods of treating and removing a photoresist pattern and a method of manufacturing a semiconductor device using the same. Other example embodiments of the present invention relate to a method of treating a photoresist pattern and a method of removing a photoresist pattern formed using a photoresist composition suitable for argon fluoride (ArF).

Example embodiments of the present invention provide a method of treating a photoresist pattern using an ozone gas, a water vapor and a cleaning solution without decomposing the photoresist pattern with a light. In the method, an ozone vapor including a water vapor and an ozone gas may be provided onto the photoresist pattern to remove a hydrophobic group from a photoresist resin included in the photoresist pattern. A cleaning solution may be provided to make the photoresist pattern soluble in water. In example embodiments of the present invention, the photoresist resin may include an acrylate polymer or a methacrylate polymer including a carbon-carbon single bond, the ozone vapor may include a hydroxyl ion and the cleaning solution may include an acid and/or alkali solution.

Example embodiments of the present invention provide a method of removing a photoresist pattern using the method of treating the photoresist pattern. In the method, an ozone vapor, including water vapor and an ozone gas, may be provided onto the photoresist pattern to remove a hydrophobic group from a photoresist resin included in the photoresist pattern. A cleaning solution may be provided to make the photoresist pattern soluble in water and may be performed to remove the photoresist pattern. In example embodiments of the present invention, the photoresist resin may include an acrylate polymer or a methacrylate polymer having a carbon-carbon single bond. The hydrophobic group from the photoresist resin may be removed using a hydroxyl ion generated from a reaction between the water vapor and the ozone gas. The ozone vapor may have an ozone density of about 150 g/m$^3$ to about 250 g/m$^3$. An ozone vapor and a cleaning solution may be provided to a photoresist pattern at a temperature of about 80° C. to about 120° C.

In example embodiments of the present invention, the photoresist pattern may become soluble in water by binding the hydroxyl ion or an alkali ion, instead of the hydrophobic group, to the photoresist resin. The photoresist pattern may become soluble using a hydroxyl ion, which is generated by the ozone gas, water vapor and a cleaning solution. Additional processes (e.g., a dissolving process) using excimer light may not be required. The photoresist pattern may become water-soluble which allows removal by a cleaning process using water and does not require more processing time and/or an additional cost. Therefore, a manufacturing process of a semiconductor device may have an enhanced throughput.

BRIEF DESCRIPTION OF THE DRAWINGS

Example embodiments of the present invention will be more clearly understood from the following detailed description taken in conjunction with the accompanying drawings.

FIG. 1 is a flow chart illustrating a method of removing a photoresist pattern in accordance with example embodiments of the present invention;

FIGS. 2 to 4 are diagrams illustrating a method of forming a photoresist pattern in a semiconductor device in accordance with example embodiments of the present invention;

FIGS. 5 to 11 are diagrams illustrating a method of forming a semiconductor device in accordance with example embodiments of the present invention;

FIG. 12 is a graph illustrating an etching rate of a photoresist pattern relative to a temperature of a chamber in accordance with example embodiments of the present invention;

FIG. 13 is a graph illustrating an etching rate of a photoresist pattern relative to a pressure of a chamber in accordance with example embodiments of the present invention.

DETAILED DESCRIPTION OF EXAMPLE EMBODIMENTS OF THE PRESENT INVENTION

Figure 1:
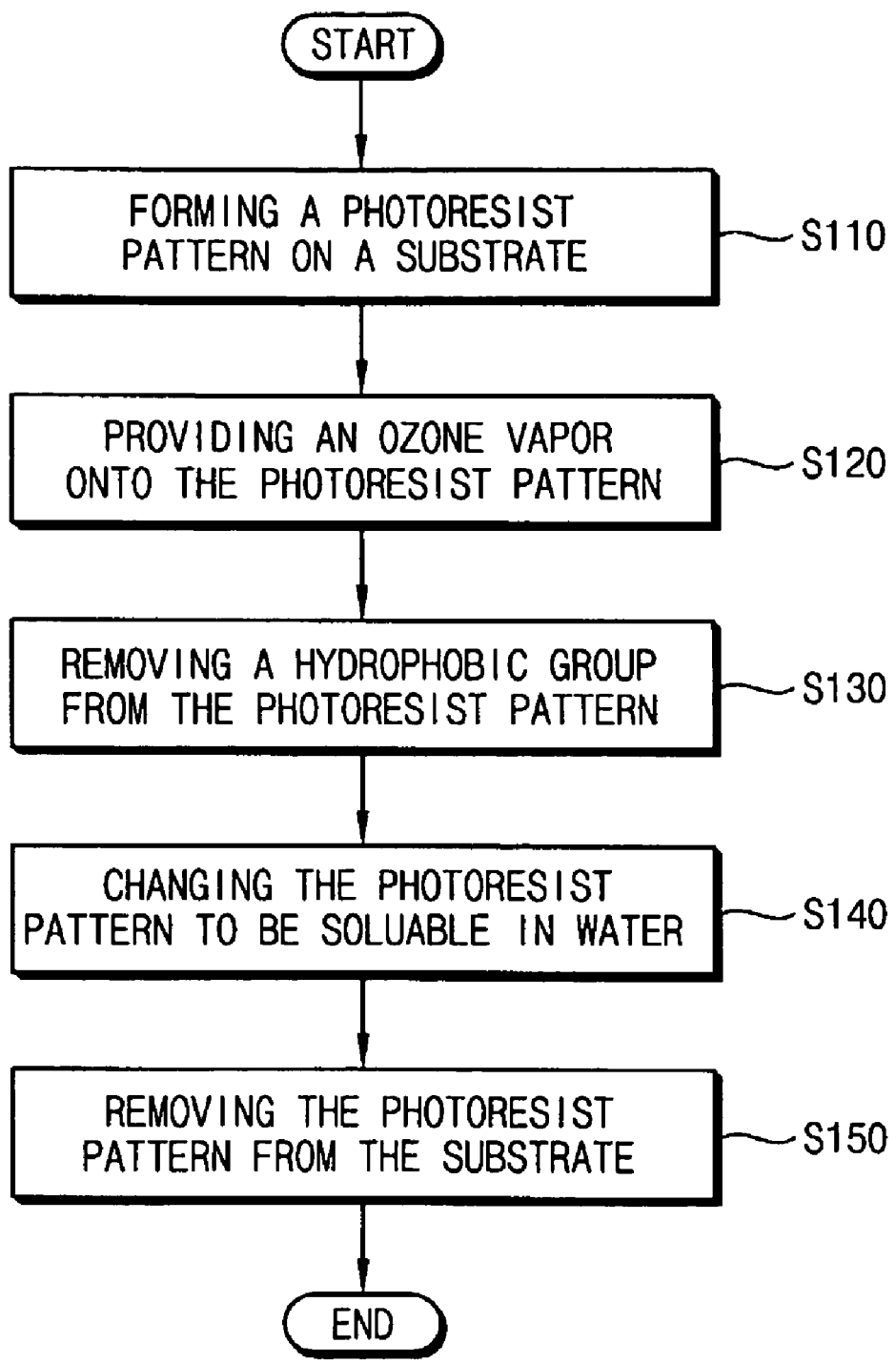
FIGS. 1-13 represent non-limiting, example embodiments of the present invention as described herein.

Example embodiments of the present invention are described more fully hereinafter with reference to the accompanying drawings, in which example embodiments of the present invention are shown. Example embodiments of the present invention may, however, be embodied in many different forms and should not be construed as limited to the example embodiments set forth herein. Rather, these embodiments are provided so that this disclosure will be thorough and complete and will fully convey the scope of example embodiments of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the present invention.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the present invention relate to methods of treating and removing a photoresist pattern and a method of manufacturing a semiconductor device using the same. Other example embodiments of the present invention relate to a method of treating a photoresist pattern and a method of removing a photoresist pattern formed using a photoresist composition suitable for argon fluoride (ArF).

Method of Treating a Photoresist Pattern

In a method of treating a photoresist pattern according to example embodiments of the present invention, a hydrophobic group included in the photoresist pattern may be removed using a vapor including an ozone ($O_3$) gas and a water ($H_2O$) vapor. The photoresist pattern may become water-soluble using a cleaning solution and may be removed.

The photoresist pattern may be formed using various photoresist compositions (e.g., photoresist compositions suitable for photolithography using an ArF light source). The photoresist composition suitable for photolithography using an ArF light source may be referred to as a photoresist composition for ArF. The photoresist composition for ArF may include a photoresist resin (e.g., an acrylate polymer and/or a methacrylate polymer containing a carbon-carbon single bond). Examples of the photoresist resin may include methacrylate, vinyl ether methacrylate (VEMA), cyclo olefin methacrylate (COMA) and/or any other suitable photoresist resin. The photoresist resin in the photoresist composition for ArF may include a hydrophobic group and may not oxidize using an ozone gas. The photoresist resin may not include a hydrophilic group so that the photoresist pattern, including the photoresist resin, may be difficult to remove from the substrate in a cleaning process with water.

In a method of treating a photoresist pattern in accordance with example embodiments of the present invention, a hydroxyl ion ($OH^-$), having a negative charge, may be formed by a reaction between ozone ($O_3$) gas and water ($H_2O$) vapor. The hydroxyl ion may serve to remove a hydrophobic group linked with the photoresist resin from the photoresist resin. The hydroxyl ion may remove the hydrophobic group such as an alkoxy group (OR) by binding with the photoresist resin instead of the hydrophobic group making the photoresist pattern water-soluble. The photoresist pattern may be treated using a cleaning solution which includes an alkali solution and/or an acid solution.

The alkali solution may have a pH value of more than about 7 and may include ammonium hydroxide solution, sodium hydroxide solution, potassium hydroxide solution and tetramethylammonium hydroxide (TMAH) solution and/or any other suitable alkali solution. The acid solution may have a pH value of less than about 7 and may include hydrochloric acid solution, nitric acid solution and sulfuric acid solution and/or any other suitable acid solution. The alkali solution may serve to provide a positive ion to the photoresist resin and the acid solution may serve to provide a hydrogen ion to the photoresist resin. In a method of example embodiments of the present invention, an additional irradiation of light may not be required. The photoresist pattern may become water-soluble using a hydroxyl ion that is generated by ozone gas, water vapor and a cleaning solution.

Method of Removing a Photoresist Pattern

FIG. 1 is a flow chart illustrating a method of removing a photoresist pattern from a substrate in accordance with example embodiments of the present invention. Referring to FIG. 1, a photoresist film may be formed on a substrate in S110. The photoresist film may be used as an etching mask in manufacturing a semiconductor device. When the photoresist film is used as the etching mask, a surface treatment process may be performed on the substrate to remove a contaminant on the substrate. A photoresist composition may be coated on the substrate and a first baking process may be performed on the substrate to form the photoresist film having enhanced adhesive characteristics. The photoresist film may be selectively exposed to light by an exposure apparatus. The light may include a laser of ArF having a wavelength of about 193 nm. A second baking process may be performed on the substrate including the photoresist film thereon. An exposed portion of the photoresist film may be removed using a developing solution. A cleaning process may be further performed to form a photoresist pattern on the substrate.

The photoresist pattern may be formed using various photoresist compositions (e.g., a photoresist composition suitable for a photolithography using an ArF light source). The photoresist composition for ArF may include a photoresist resin like an acrylate polymer or a methacrylate polymer having a carbon-carbon single bond (e.g., methacrylate, vinyl ether methacrylate (VEMA), cyclo olefin methacrylate (COMA), and/or any other suitable polymer). The photoresist resin in the photoresist composition for ArF may include a hydrophobic group and may not be directly oxidized by an ozone gas. The photoresist resin may not include a hydrophilic group so that the photoresist pattern may be difficult to remove from the substrate in a cleaning process with water.

An ozone ($O_3$) vapor may be provided onto the substrate having the photoresist pattern at S120. The ozone vapor may include an ozone ($O_3$) gas and a water ($H_2O$) vapor. The ozone vapor may serve to remove a hydrophobic group linked with the photoresist resin from the photoresist pattern and may include a hydroxyl ion ($OH^-$). The hydroxyl ion ($OH^-$), having a negative charge, may be formed by a reaction between an ozone gas and a water vapor. The ozone vapor may not directly react with the photoresist resin and may be provided on the substrate to generate the hydroxyl ion having a negative charge. In example embodiments of the present invention, the hydroxyl ion generated from the ozone vapor may serve to remove the hydrophobic group from the photoresist resin.

The ozone vapor may include an ozone density of about 150 $g/m^3$ to about 250 $g/m^3$. When a density of ozone included in the ozone vapor is less than about 150 $g/m^3$, generation of the hydroxyl ion may be reduced so that the efficiency of removing a hydrophobic group may be lowered and a processing time for removing the photoresist pattern may be increased. When the density of ozone included in the ozone vapor is greater than about 250 $g/m^3$, the ozone vapor may have difficulty forming. The ozone vapor may include ozone ($O_3$), oxygen ($O_2$) and/or an oxygen radical and also may include a hydrogen ion ($H^+$) having a positive charge and a hydroxyl ion ($OH^-$) having a negative charge.

A hydrophobic group may be removed from the photoresist resin in the photoresist pattern using a hydroxyl ion included in the ozone vapor at S130. The hydroxyl ion may be formed by a reaction between the ozone gas and the water vapor. The hydroxyl ion may serve to remove the hydrophobic group such as an alkoxy group (OR) from the photoresist resin by binding with carbon included in the photoresist resin, instead of the hydrophobic group. As the hydrophobic group is removed from the photoresist resin by binding with the hydroxyl ion, the photoresist resin may include a carboxyl ion ($COO^-$) having a negative charge. The carboxyl ion has a negative charge so that the carboxyl ion may bind with a hydrogen ion (H⁺) or an alkali ion having a positive charge. The carboxyl ion may serve to provide a positive ion-binding site.

The hydrophobic group removed from the photoresist resin by binding with the hydroxyl ion may include an oxygen ion having a negative charge. The oxygen ion of the hydrophobic group may bind with a hydrogen ion (H⁺) that remains in the photoresist resin. The hydrophobic group may include a hydroxyl group, so that the hydrophobic group may be changed into a hydrophilic group. In example embodiments of the present invention, a process for removing the hydrophobic group from the photoresist resin may be performed at a temperature of about 90° C. to about 120° C. and under a pressure of about 40 kPa to about 100 kPa. When the process for removing the hydrophobic group is performed at a temperature less than about 90° C., the rate of removal of the hydrophobic group may be decreased. When the process for removing the hydrophobic group is performed at a temperature higher than about 120° C., a thermal stress of structures included in the substrate may be increased.

A cleaning solution may be provided onto the photoresist pattern to make the photoresist pattern water-soluble at S140. In example embodiments of the present invention, a process for providing the cleaning solution may be performed at a temperature of about 90° C. to about 120° C. and under a pressure of about 40 kPa to about 100 kPa. The cleaning solution provided for forming a soluble photoresist pattern may include an alkali solution and/or an acid solution.

The alkali solution may have a pH value of more than about 7. Examples of the alkali solution may include an ammonium hydroxide solution, a sodium hydroxide solution, a potassium hydroxide solution and a tetramethylammonium hydroxide (TMAH) solution and/or any other suitable alkali solution. When the alkali solution includes the ammonium hydroxide solution, the ammonium hydroxide solution may have an ammonium ion (NH₄⁺) having a positive charge and a hydroxyl ion (OH⁻) having a negative charge. When the ammonium hydroxide solution is provided onto the photoresist pattern, the ammonium ion included in the ammonium hydroxide solution may bind with the positive ion-binding site included in the photoresist resin. The photoresist resin may include an ammonium salt which has hydrophilic characteristics and so may be soluble in water. For example, when the alkali solution includes the TMAH solution, the TMAH solution may have a tetramethylammonium ion having a positive charge and a hydroxyl ion having a negative charge. When the TMAH solution is provided onto the photoresist pattern, the tetramethylammonium ion included in the TMAH solution may bind with the positive ion-binding site included in the photoresist resin. The photoresist resin may include a tetramethylammonium salt which has hydrophilic characteristics and so may be soluble in water.

The acid solution may have a pH value of less than about 7. Examples of the acid solution may include a hydrochloric acid solution, a nitric acid solution, a sulfuric acid solution and/or any other suitable acid solution. The acid solution may serve to provide a hydrogen ion to the photoresist resin. When the hydrogen ion binds with the positive ion-binding site included in the photoresist resin, the photoresist resin may include a hydroxyl ion. The hydroxyl ion may have hydrophilic characteristics so that the photoresist pattern may be soluble in water.

The photoresist pattern having hydrophilic characteristics may be removed from the substrate by a cleaning process using water at S150. The cleaning process may remove the photoresist pattern from the substrate with water. In example embodiments of the present invention, the cleaning process may be carried out by an ultrasonic cleaning process. The ultrasonic cleaning process may be performed by immersing the substrate into a water bath. In other example embodiments of the present invention, the cleaning process may be performed by spraying water on a surface of a rotating substrate. The substrate may be cleaned by spraying water because the photoresist pattern is soluble in water. A dry process using a vapor (e.g., isopropyl alcohol vapor) may be further carried out on the substrate.

In example embodiments of the present invention, a reaction mechanism of forming a soluble photoresist pattern may include a mechanism represented by the following chemical formula:

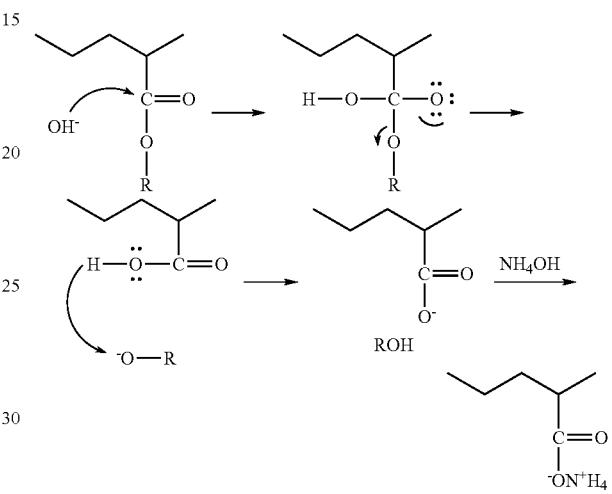

In a method of removing a photoresist pattern in accordance with example embodiments of the present invention, the photoresist pattern may be removed using an ozone gas, a cleaning solution and water. An additional process (e.g., a dissolving process) using excimer light may not be required. The photoresist pattern formed on the substrate may be substantially removed without additional processes, so that a manufacturing process of a semiconductor device may have an enhanced throughput.

Method of Forming a Pattern

Figure 2:
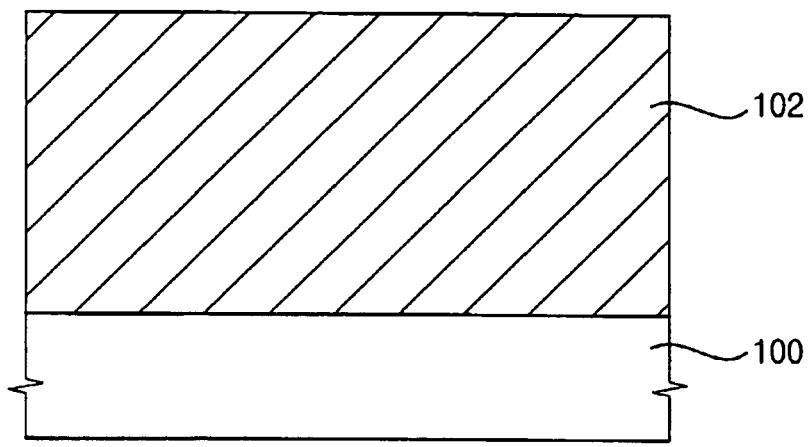
Figure 3:
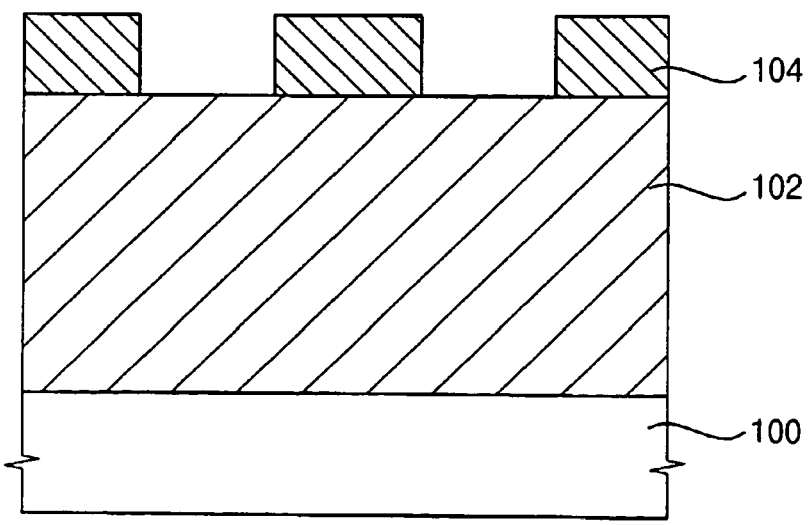
Figure 4:
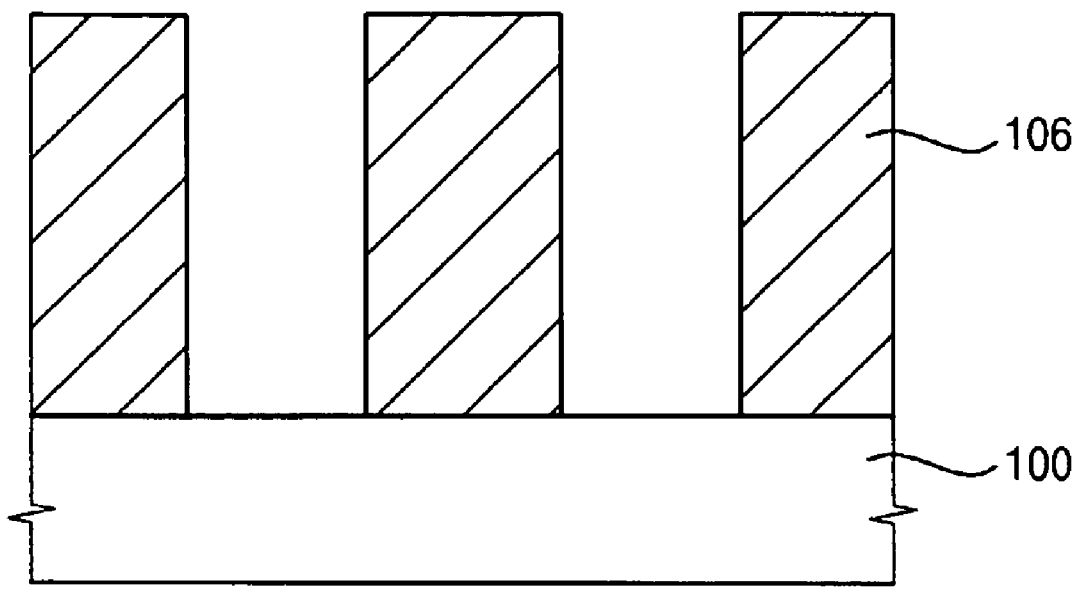

FIGS. 2 to 4 are diagrams illustrating a method of forming a pattern in a semiconductor device in accordance with example embodiments of the present invention. Referring to FIG. 2, a structure 102 may be formed on a substrate 100. The structure 102 may include a metal layer, a metal oxide layer, a metal nitride layer, an oxide layer, a polysilicon layer, a barrier layer and/or any other suitable layer. The structure 102 may be formed in a single-layered structure or in a multi-layered structure.

The metal layer may be formed using tungsten, aluminum, titanium, copper and/or any other suitable metal. The metal nitride layer may be formed using tungsten nitride, titanium nitride aluminum nitride and/or any other suitable metal nitride. The oxide layer may include boro phosphor silicate glass (BPSG), phosphor silicate glass (PSG), undoped silicate glass (USG), spin on glass (SOG), plasma enhanced-tetraethyl orthosilicate (PE-TEOS), high density plasma-chemical vapor deposition (HDP-CVD) oxide and/or the like. The structure 102 may be used to form a semiconductor device (e.g., a dynamic random access memory (DRAM) device, a static random access memory (SRAM) device, a flash memory device and/or any other suitable semiconductor device). In example embodiments of the present invention, the structure 102 may be formed in a structure that includes a polysilicon layer and an oxide layer formed on the polysilicon layer. In other example embodiments of the present invention, the structure 102 may be formed in a structure that includes a metal layer and an oxide layer formed on the metal layer.

Referring to FIG. 3, a photoresist pattern 104 may be formed on the structure 102. The photoresist pattern 104 may expose a portion of the structure 102. In example embodiments of the present invention, a photoresist composition for ArF may be coated on the structure 102 to form a photoresist film. The photoresist composition may include an acrylate polymer and/or a methacrylate polymer having a carbon-carbon single bond. A light-exposure process and/or a developing process may be performed on the photoresist film to form a photoresist pattern 104 on the structure 102. The photoresist pattern 104 may be used as an etching mask.

Referring to FIG. 4, an exposed portion of the structure 102 may be selectively etched using the photoresist pattern 104 as an etching mask. A structure pattern 106 having an opening may be formed. The structure pattern 106 may be used for forming a metal wiring and/or an insulation layer pattern applied to the DRAM device, the SRAM device, the flash memory device and/or any other suitable device. The structure pattern 106 may be formed by a dry etching process using an etching gas, plasma and/or the like. The photoresist pattern 104 on the structure pattern 106 may be removed from the structure pattern 106 according to a method substantially the same as the method described in FIG. 1. Ozone ($O_3$) vapor including water ($H_2O$) vapor and ozone ($O_3$) gas may be provided onto the substrate 100 to remove the photoresist pattern 104. The ozone gas may have a density of about 150 $g/m^3$ to about 250 $g/m^3$. A hydroxyl ion ($OH^-$) having a negative charge may be formed by a reaction between an ozone gas and a water vapor. The hydroxyl ion may serve to remove a hydrophobic group linked with the photoresist resin and included in the photoresist pattern 104. As the hydroxyl ion binds with carbon of the photoresist resin, instead of the hydrophobic group, the hydrophobic group may be removed from the photoresist resin.

A cleaning solution may be provided onto the photoresist pattern 104. The photoresist pattern 104 may be water-soluble. The cleaning solution may include an alkali solution and/or an acid solution. As the hydrophobic group may be removed from the photoresist resin by the cleaning solution, the photoresist resin may include a hydrophilic group (e.g., a hydroxyl group and/or an alkali salt). In example embodiments of the present invention, processes with the ozone vapor and the cleaning solution may be performed at a temperature of about 90° C. to about 120° C.

A cleaning process may be performed using water to remove the photoresist pattern 104 from the structure pattern 106. In example embodiments of the present invention, the cleaning process may be carried out by an ultrasonic cleaning process. In other example embodiments of the present invention, the cleaning process may be performed by spraying water on a surface of rotating substrate 100.

In accordance with example embodiments of the present invention, a method of removing a photoresist pattern 104 may be applied to the manufacturing process of a semiconductor device (e.g., the DRAM device, the SRAM device, the flash memory device and/or any other suitable semiconductor device). The method of example embodiments of the present invention may increase the productivity of a semiconductor device. A method of manufacturing a semiconductor by removing a photoresist pattern in accordance with example embodiments of the present invention will be described hereinafter.

Method of Manufacturing a Semiconductor Device

Figure 5:
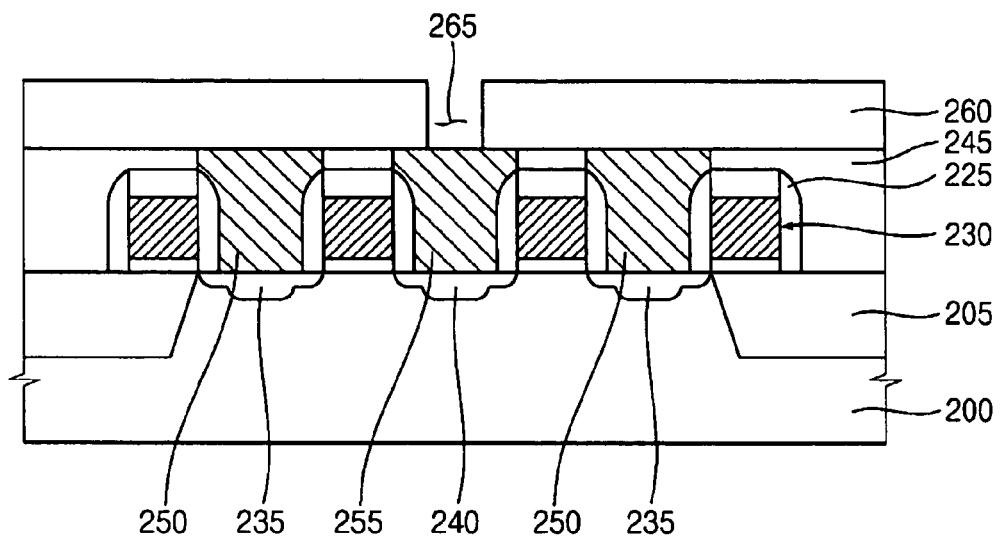

FIGS. 5 to 11 are diagrams illustrating a method of manufacturing a semiconductor device in accordance with example embodiments of the present invention. Referring to FIG. 5, an isolation layer 205 may be formed on a substrate 200 by an isolation process (e.g., a shallow trench isolation (STI) process and/or the like) to define an active region and a field region on the substrate 200.

A gate insulation layer may be formed on the substrate 200 including the isolation layer 205 thereon. The gate insulation layer may be formed by a thermal oxidation process, a chemical vapor deposition (CVD) process, an atomic layer deposition (ALD) process and/or any other suitable process. The gate insulation layer may be formed using silicon oxide or a material having a higher dielectric constant than that of silicon oxide. Examples of the material having a high dielectric constant may include hafnium oxide ($HfO_2$), zirconium oxide ($ZrO_2$), tantalum oxide ($Ta_2O_5$), yttrium oxide ($Y_2O_3$), niobium oxide ($Nb_2O_5$), aluminum oxide ($Al_2O_3$), titanium oxide ($TiO_2$), cerium oxide ($CeO_2$), indium oxide ($In_2O_3$), ruthenium oxide ($RuO_2$), magnesium oxide (MgO), strontium oxide (SrO), boron oxide ($B_2O_3$), tin oxide ($SnO_2$), lead oxide (PbO, $PbO_2$, $Pb_3O_4$), vanadium oxide ($V_2O_3$), lanthanum oxide ($La_2O_3$), praseodymium oxide ($Pr_2O_3$), antimony oxide ($Sb_2O_3$, $Sb_2O_5$), calcium oxide (CaO) and/or any other suitable material and/or a mixture thereof.

A first conductive layer and a gate mask may be successively formed on the gate insulation layer. The first conductive layer may be formed using polysilicon doped with impurities and may be patterned to a gate electrode. The first conductive layer may also be formed in a polycide structure that includes a polysilicon layer and a metal silicide layer formed on the polysilicon layer. The gate mask may be formed using a material having an etch selectivity relative to that of a first insulation interlayer 245 to be formed in a subsequent process. When the first insulation interlayer 245 is formed using an oxide (e.g., silicon oxide), the gate mask may be formed using a nitride (e.g., silicon nitride). In the formation of the gate mask, a nitride layer may be formed and then a first photoresist pattern (not shown) may be formed on the nitride layer. The nitride layer may be dry-etched using the first photoresist pattern as an etching mask to form the gate mask.

The first photoresist pattern may be removed in accordance with a method substantially the same as described in FIG. 1. For example, ozone vapor, including ozone gas and water vapor, may be provided onto the first photoresist pattern, thereby removing a hydrophobic group linked with a photoresist resin from the photoresist resin. A cleaning solution may be provided onto the first photoresist pattern to change the first photoresist pattern to be soluble in water. The first photoresist pattern may be cleaned with water and may be removed from the substrate 200.

The first conductive layer and the gate insulation layer may be successively patterned using the gate mask as an etching mask. A gate structure 230 including a gate insulation layer pattern, a gate electrode and the gate mask may be formed on the substrate 200. An insulation interlayer may be formed on the substrate 100 including the gate structure 230 thereon. The insulation interlayer may be formed using a nitride (e.g., silicon nitride), and then, may be anisotropically etched to form a gate spacer 225 on both sidewalls of the gate structure 230.

Impurities may be implanted into surface portions of the substrate 200 by an ion implantation process using the gate structure 230 as an ion implantation mask. A thermal treatment process may be performed on the substrate 200 to form a first contact region 235 and a second contact region 240. The first contact region 235 may correspond to a source region and the second contact region 240 may correspond to a drain region. The first contact region 235 may also correspond to a capacitor contact region where a first pad makes contact and the second contact region 240 may also correspond to a bit line contact region where a second pad makes contact. Transistors, including the gate structure 230, the gate spacer 225 and the first and the second contact regions 235 and 240, respectively, may be formed on the substrate 200.

The first insulation interlayer 245 may be formed to cover the gate structure 230. The first insulation interlayer 245 may be formed using an oxide (e.g., BPSG, PSG, SOG, USG, PE-TEOS, HDP-CVD oxide and/or any other suitable oxide) and may be formed by a deposition process (e.g., a chemical vapor deposition (CVD) process, a plasma enhanced-CVD (PE-CVD) process, a high density plasma-CVD (HDP-CVD) process, an atomic layer deposition (ALD) process and/or any other suitable deposition process). The first insulating layer 245 may be partially removed by a chemical mechanical polishing (CMP) process, an etch back process and/or a combination of CMP and etch back processes. In example embodiments of the present invention, the first insulation interlayer 245 may be a given height from the gate mask 220. In other example embodiments of the present invention, the first insulation interlayer 245 may be partially removed until the gate mask 220 may be exposed, so that the first insulating interlayer 245 may have a height substantially the same as that of the gate structure 230.

A second photoresist pattern (not shown) may be formed on the first insulation interlayer 245. The first insulation interlayer 245 may be partially etched using the second photoresist pattern as an etching mask to form first contact holes. The first contact holes may expose the first and the second contact regions 235 and 240 through the first insulation interlayer 245. The first contact holes may be self-aligned with respect to the gate structure 230 and expose the first and the second contact regions 235 and 240. A portion of the first contact holes may expose the first contact region 235 and another portion of the first contact holes may expose the second contact region 240.

The second photoresist pattern may be removed in accordance with example embodiments of the present invention. An ozone vapor including ozone gas and water vapor may be provided onto the second photoresist pattern to remove a hydrophobic group linked with a photoresist resin. The photoresist resin may be included in the second photoresist pattern. A cleaning solution may be provided onto the second photoresist pattern to make the second photoresist pattern soluble in water, and then, the second photoresist pattern may be cleaned using water. The second photoresist pattern may then be removed from the substrate 200.

A second conductive layer may be formed on the first insulation interlayer 245 to fill the first contact holes. The second conductive layer may be formed using polysilicon doped with impurities, a metal, a conductive metal nitride and/or the like. The second conductive layer may be partially removed by a CMP process, an etch back process and/or a combination process of CMP and etch back until the first insulation interlayer 245 is exposed. A first pad 250 and a second pad 255 may be formed in the first contact holes. The first pad 250 may be formed in order to make electrical contact with the first contact region 235 and the second pad 255 may be formed in order to make electrical contact with the second contact region 240.

A second insulation interlayer 260 may be formed on the first insulation interlayer 245 including the first and the second pads 250 and 255 therein. The second insulation interlayer 260 may serve to electrically insulate the first pad 250 with a bit line to be formed in a subsequent process. The second insulation interlayer 260 may be formed using an oxide (e.g., BPSG, PSG, SOG, USG, PE-TEOS, HDP-CVD oxide and/or any other suitable oxide). The second insulation interlayer 260 may be formed by a deposition process (e.g., a CVD process, a PE-CVD process, an HDP-CVD process, an ALD process and/or any other suitable deposition process). In example embodiments of the present invention, the second insulation interlayer 260 may be formed using a material substantially the same as that of the first insulation interlayer 245. In other example embodiments of the present invention, the second insulation interlayer 260 may be formed using a material different from that of the first insulation interlayer 245.

The second insulating layer 260 may be partially removed by a CMP process, an etch back process and/or a combination process of CMP and etch back. A third photoresist pattern (not shown) may be formed on the second insulation interlayer 260. The second insulation interlayer 260 may be partially etched using the third photoresist pattern as an etching mask. A second contact hole 265 exposing the second pad 255 may be formed in the second insulation interlayer 260. The second contact hole 265 may be used to form a bit line electrically connecting the second pad 255 with the bit line.

Figure 6:
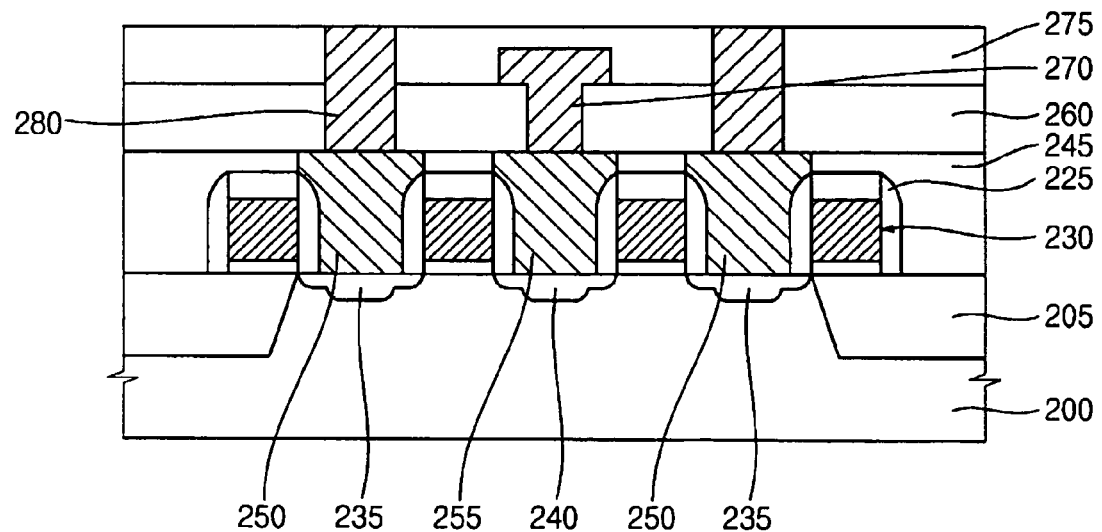

Referring to FIG. 6, the third photoresist pattern may be removed in accordance with example embodiments of the present invention. Ozone vapor including an ozone gas and a water vapor may remove a hydrophobic group linked with a photoresist resin, included in the third photoresist pattern, from the photoresist resin. A cleaning solution may be provided onto the third photoresist pattern to make the third photoresist pattern soluble in water and then may be cleaned with water. The third photoresist pattern may be removed from the substrate 200. A third conductive layer may be formed on the second insulation interlayer 260 to fill the second contact hole 265.

A fourth photoresist pattern (not shown) may be formed on the third conductive layer. The third conductive layer may be etched using the fourth photoresist pattern as an etching mask to form a bit line 270. The bit line 270 may be electrically connected to the second pad 255. The fourth photoresist pattern may be removed in accordance with example embodiments of the present invention. Ozone vapor including an ozone gas and a water vapor may remove a hydrophobic group linked with a photoresist resin, included in the fourth photoresist pattern, from the photoresist resin. A cleaning solution may be provided onto the fourth photoresist pattern to make the fourth photoresist pattern soluble in water and then may be cleaned with water. The fourth photoresist pattern may be removed from the substrate 200.

In example embodiments of the present invention, the bit line 270 may be formed in a structure that includes a first layer having a metal/metal complex (e.g., titanium/titanium nitride) and a second layer having a metal (e.g., tungsten) formed on the first layer. A third insulation interlayer 275 may be formed on the second insulation interlayer 260 to cover the bit line 270. The third insulation interlayer 275 may be formed using an oxide (e.g., BPSG, PSG, SOG, USG, PE-TEOS, HDP-CVD oxide and/or any other suitable oxide). In example embodiments of the present invention, the third insulation interlayer 275 may be formed using a material substantially the same as that of the second insulation interlayer 260. In other example embodiments of the present invention, the third insulation interlayer 275 may be formed using a material different from that of the second insulation interlayer 260.

The third insulation interlayer 275 may be partially removed by a CMP process, an etch back process and/or a combination process of CMP and etch back. In example embodiments of the present invention, an additional insulation interlayer including a nitride may be further formed on the second insulation interlayer 260 and the bit line 270. The third insulation interlayer 275 may be formed on the additional insulation interlayer. The additional insulation interlayer may prevent a void or a seam from generating in the third insulation interlayer 275.

A fifth photoresist pattern may be formed on the third insulation interlayer 275. The third and the second insulation interlayers 275 and 260 may be partially etched using the fifth photoresist pattern as an etching mask. A third contact hole exposing the first pad 250 may be formed. The third contact hole may be used as a capacitor contact hole. The fifth photoresist pattern may be removed in accordance with example embodiments of the present invention. Ozone vapor including an ozone gas and a water vapor may remove a hydrophobic group linked with a photoresist resin, included in the fifth photoresist pattern, from the photoresist resin. A cleaning solution may be provided onto the fifth photoresist pattern to make the fifth photoresist pattern soluble in water and then may be cleaned with water. The fifth photoresist pattern may be removed from the substrate 200.

A fourth conductive layer may be formed on the third insulation interlayer 275 to fill the third contact hole. The fourth conductive layer may be partially removed by a CMP process, an etch back process and/or a combination process of CMP and etch back, thereby forming a third pad 280. The third pad 280 may be formed using polysilicon doped with impurities, a metal, a conductive metal nitride, and/or any other suitable material. The third pad 280 may serve to electrically connect the first pad 250 with a lower electrode layer to be formed in a subsequent process.

Figure 7:
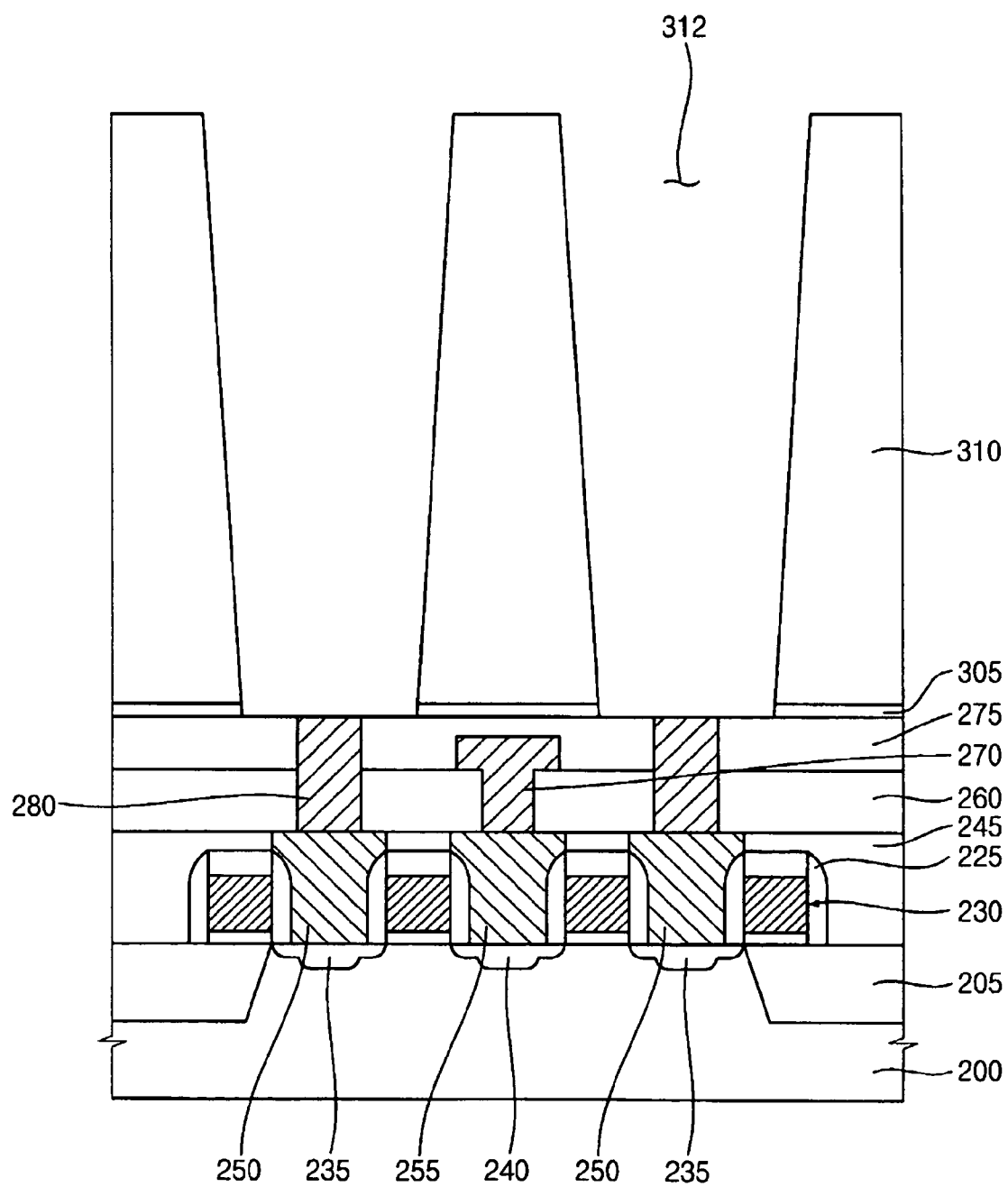

FIG. 7 is a diagram illustrating a process of forming an etch stop layer and a mold layer pattern including an opening according to example embodiments of the present invention. Referring to FIG. 7, an etch stop layer 305 may be formed on the third insulation interlayer 275 and the third pad 280. The etch stop layer 305 may serve to prevent etching damage to the third pad 280 in an etching process of a mold layer. The etch stop layer 305 may be formed having a thickness of about 10 Å to about 200 Å. The etch stop layer 305 may be formed using a nitride and/or a metal oxide having an etching selectivity relative to that of a mold layer.

The mold layer may be formed on the etch stop layer 305. The mold layer may be formed using an oxide (e.g., BPSG, PSG, USG, SOG, PE-TEOS, HDP-CVD oxide and/or any other suitable oxide). The mold layer may be formed having a thickness of about 10,000 Å to about 20,000 Å. The thickness of the mold layer may be controlled to maintain a capacitance required for a capacitor. A mask pattern (not shown) may be formed on the mold layer. The mold layer may be anisotropically etched using the mask pattern as an etching mask. The etch stop layer 275 may be successively etched using the mask pattern as an etching mask and an opening 312 exposing the third pad 280 may be formed. The mold layer may be patterned to a mold layer pattern 310.

Figure 8:
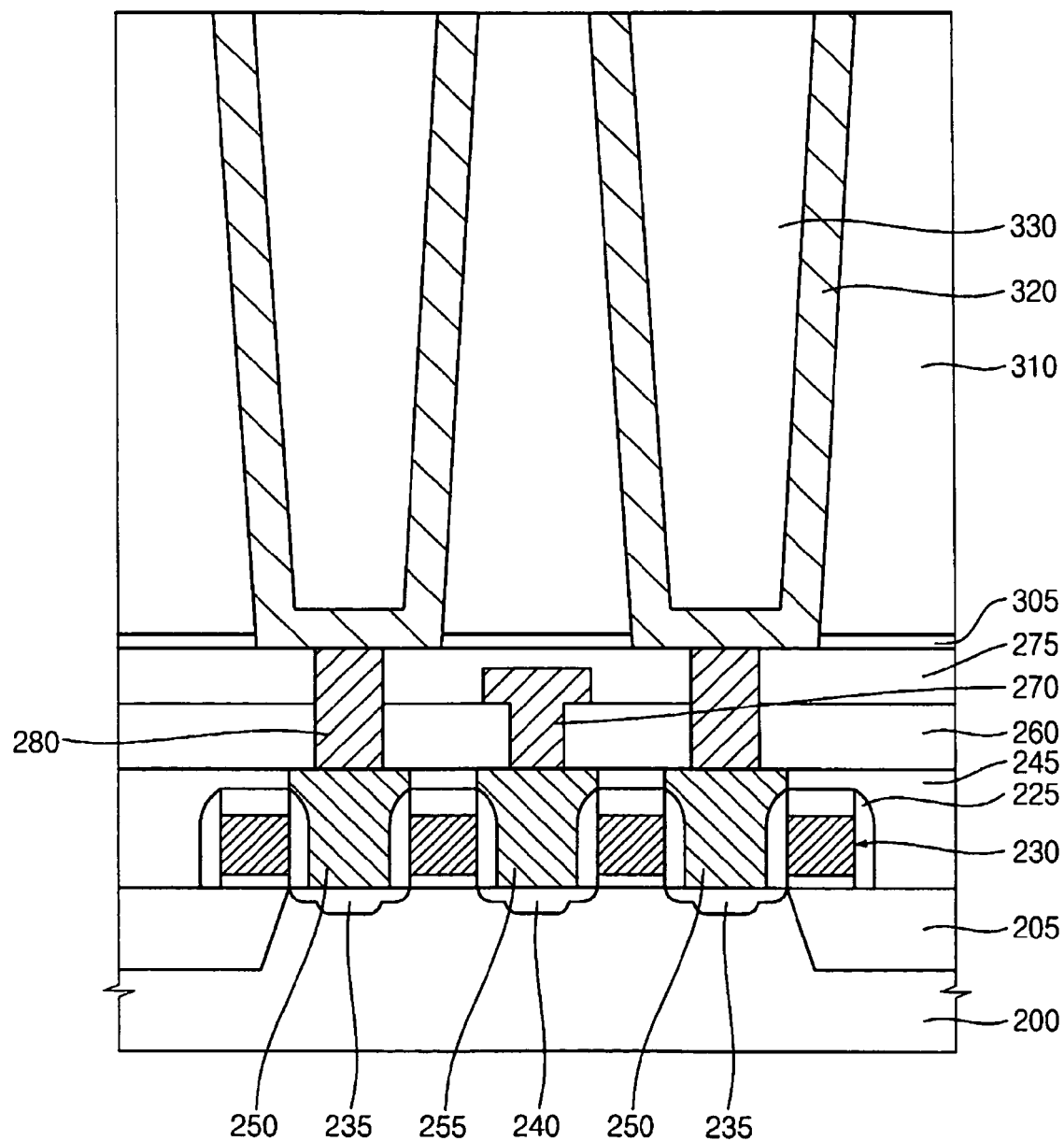

FIG. 8 is a diagram illustrating a process of forming a lower electrode layer and a sacrificial layer according to example embodiments of the present invention. A lower electrode layer may be conformably formed in the opening 312 and on a surface of the mask pattern. The lower electrode layer may be formed using a metal (e.g., tungsten, titanium and/or any other suitable metal) or a conductive metal nitride (e.g., tungsten nitride, titanium nitride and/or any other suitable metal nitride). The lower electrode layer may have a thickness of about 300 Å to about 500 Å.

Figure 9:
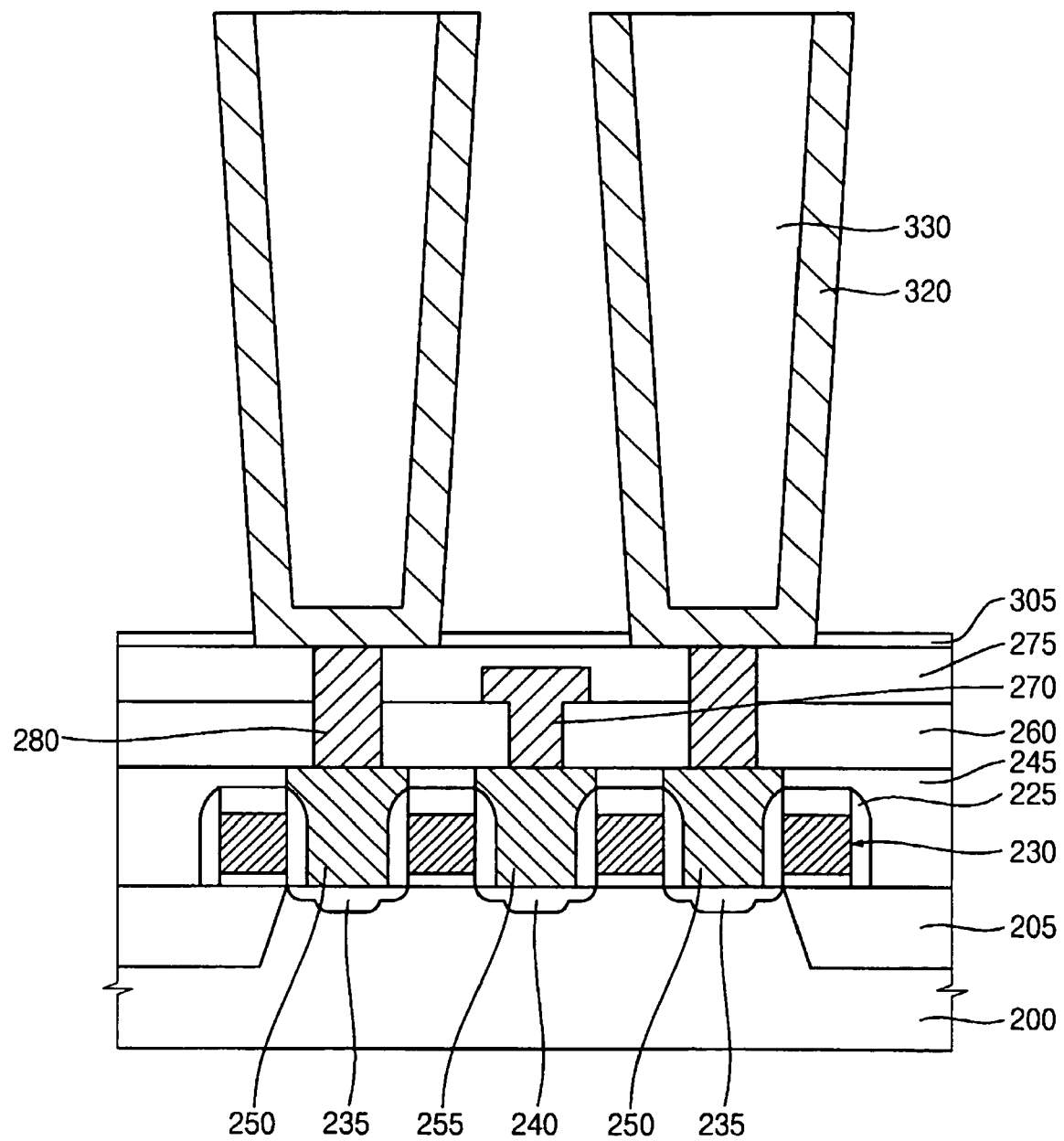

A sacrificial layer may be formed on the lower electrode layer to fill the opening 312. In example embodiments of the present invention, the sacrificial layer may be formed using an oxide. In other example embodiments of the present invention, the sacrificial layer may be formed using a photoresist pattern. The sacrificial layer, the lower electrode layer and the mask pattern are successively removed until the mold layer pattern 310 may be exposed. Hence, a lower electrode 320 having a cylindrical shape and a sacrificial layer pattern 330 may be formed in the opening 312. Referring to FIG. 9, the mold layer pattern 310 may be removed by an etching process using an etching solution. The etching solution may include a LAL solution. As the mold layer pattern 310 is removed, the lower electrode 320 may be exposed from the substrate 200.

Figure 10:
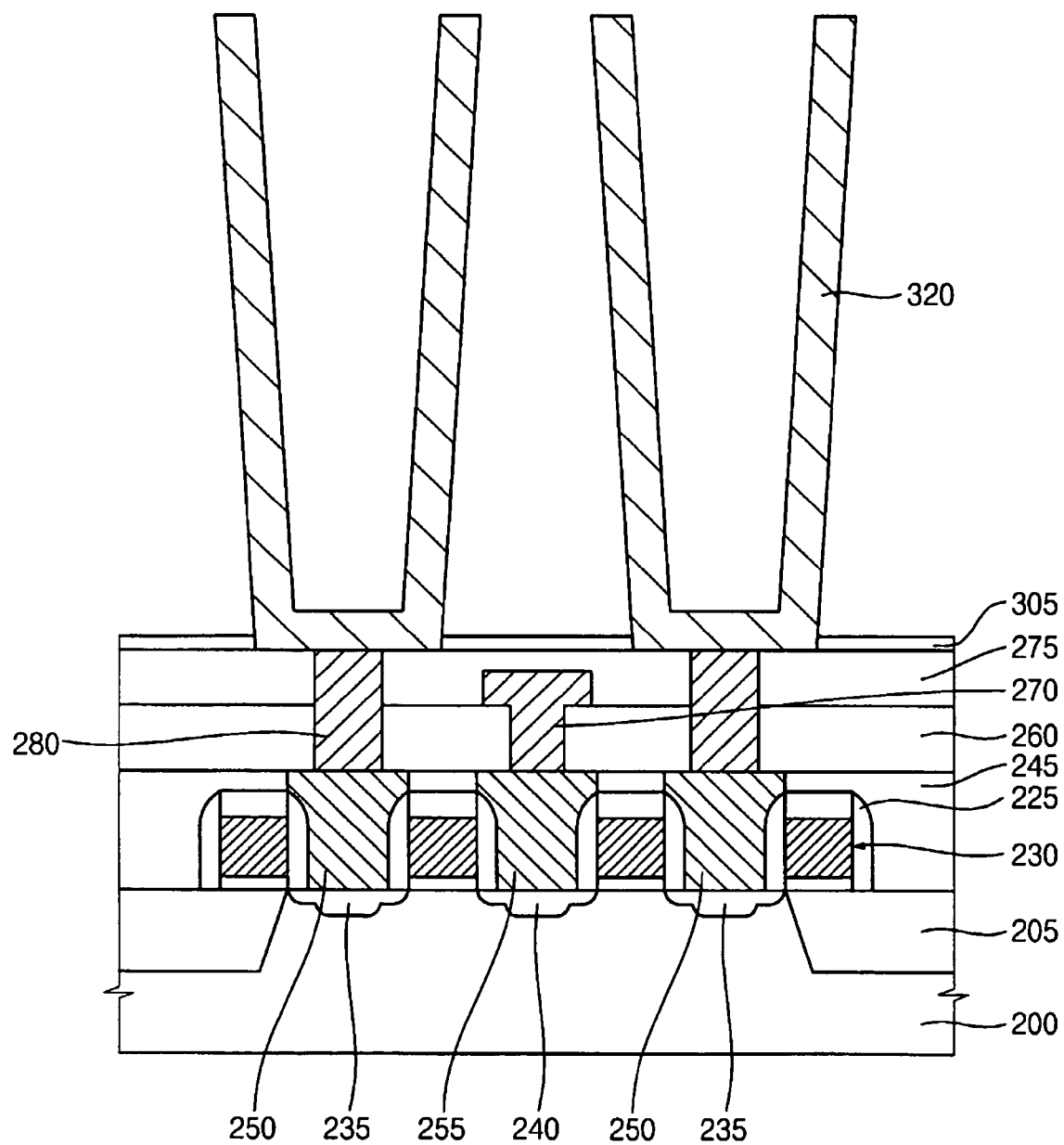

Referring to FIG. 10, the sacrificial layer pattern 330 may be removed. When the sacrificial layer pattern 330 includes a photoresist pattern, the sacrificial layer pattern 330 may be removed in accordance with example embodiments of the present invention. Ozone vapor including an ozone gas and a water vapor may remove a hydrophobic group linked with a photoresist resin included in the sacrificial layer pattern 330 from the photoresist resin. A cleaning solution may be provided onto the sacrificial layer pattern 330 to make the sacrificial layer pattern 330 soluble in water and then may be cleaned with water. The sacrificial layer pattern 330 may be removed from the substrate 200 and the lower electrode 320 may be completely formed on the substrate 200. The lower electrode 320 may have a cylindrical shape. The lower electrode 320 may electrically contact the third contact pad 280 and may have an improved aspect ratio. The lower electrode 320 may also be arranged adjacent to a respective cell area.

Figure 11:
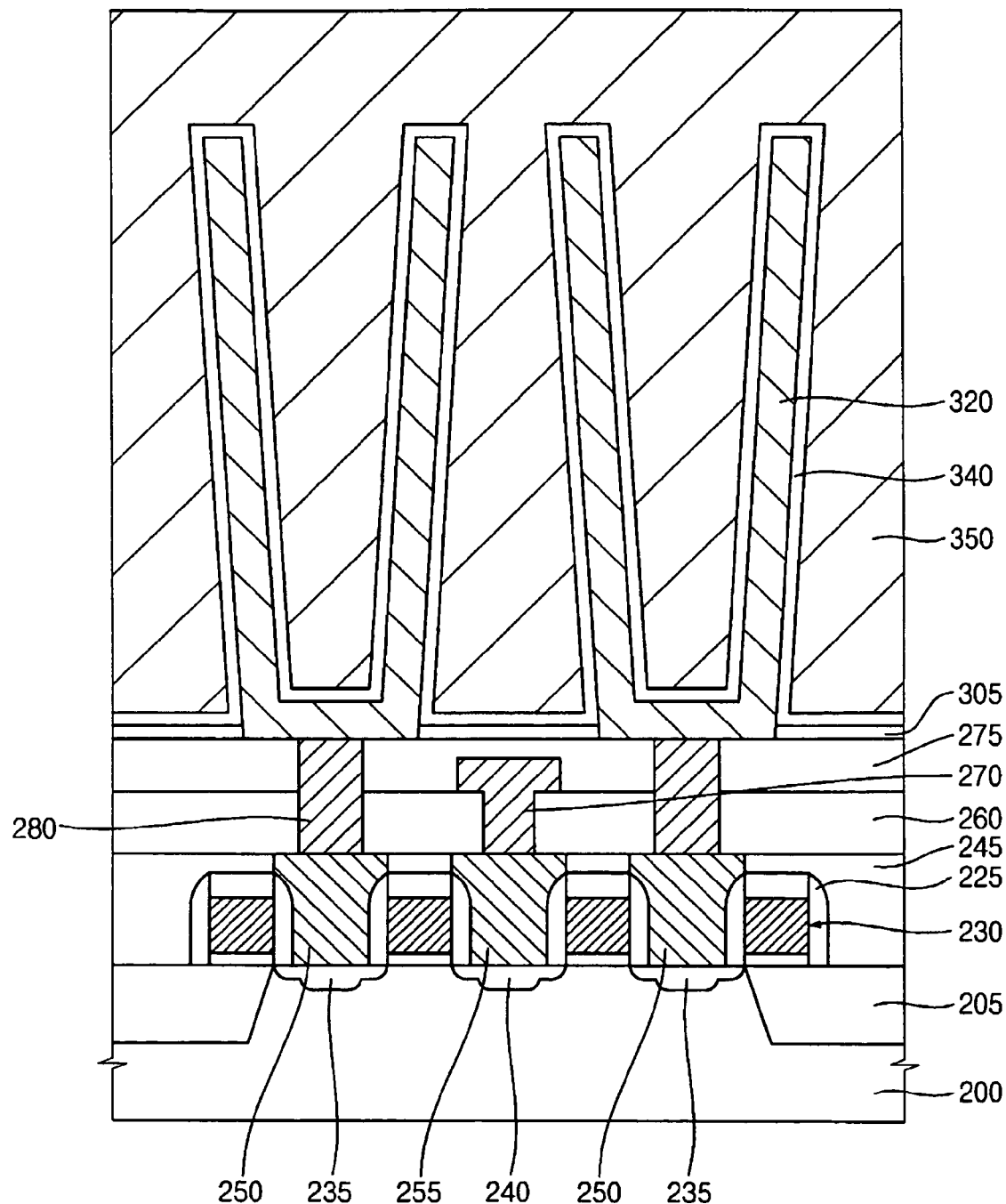

FIG. 11 is a diagram illustrating a process of forming a dielectric layer and an upper electrode according to example embodiments of the present invention. A dielectric layer 340 may be formed on the lower electrode layer 320. The dielectric layer 340 may be formed using an oxide/a nitride, an oxide/a nitride/an oxide, a metal oxide and/or any other suitable material. In example embodiments of the present invention, the dielectric layer 340 may be formed using a metal oxide that has a thin equivalent oxide thickness (EOT) and a higher dielectric constant.

The dielectric layer 340 may be formed by an ALD process. When the dielectric layer 340 is formed by the ALD process, a unit process, which includes providing a reactant, purging the reactant, providing an oxidant and purging the oxidant, may be repeated at least once. The dielectric layer 340, including the metal oxide, may be formed on the lower electrode 320. The reactant may include a metal precursor. Examples of the metal precursor may include a hafnium precursor (e.g., tetrakis ethyl methyl amino hafnium (Hf[$NC_2H_5CH_3$]$_4$; TEMAH), hafnium butyl oxide (Hf(OtBu)$_4$) and/or any other suitable hafnium precursor) and/or an aluminum precursor (e.g., trimethyl aluminum (Al(CH$_3$)$_3$) and/or any other suitable aluminum precursor). Examples of the oxidant may include ozone ($O_3$), oxygen ($O_2$), water ($H_2O$), an oxygen plasma, a remote oxygen plasma and/or any other suitable oxidant.

An upper electrode 350 may be formed on the dielectric layer 340. The upper electrode 350 may be formed using polysilicon, a metal, a metal nitride and/or the like. As an integration degree of the semiconductor device becomes higher, a metal nitride may be beneficial for the upper electrode 350. The upper electrode 350 may be formed by a CVD process using titanium nitride. When the upper electrode 350 is formed by the CVD process, the CVD process may be performed at a temperature of less than about 550° C. using a reactant gas (e.g., a titanium tetrachloride (TiCl$_4$) gas, an ammonia (NH$_3$) gas and/or any other suitable gas).

A capacitor including the lower electrode 320, the dielectric layer 340 and the upper electrode 350 may be formed on the substrate 200. In example embodiments of the present invention, the capacitor may be formed having a cylindrical shaped lower electrode, so that the capacitor may have enough capacitance. When the lower electrode 320 is formed using an etching solution (e.g., a LAL solution) including an organic compound, a residual organic compound on the lower electrode 320 may be effectively removed by an ozone solution and the capacitor having improved characteristics may be formed.

Evaluation of Removal of a Photoresist Pattern

In accordance with example embodiments of the present invention, the removal of a photoresist pattern using an ozone vapor including an ozone gas and a water vapor was evaluated. A photoresist pattern was formed on a substrate using a photoresist composition for ArF. A thickness of the photoresist pattern was about 20,000 Å and an average variation of the thickness of the photoresist pattern was about 10 percent.

EXAMPLE 1

A substrate including the above-mentioned photoresist pattern was loaded in a chamber. An ozone vapor including an ozone gas and a water vapor was introduced into the chamber. The ozone gas included a hydroxyl ion and a density of the ozone gas was about 200 g/m$^3$. The ozone vapor and the photoresist pattern were reacted for about one minute. A surface treatment process using an ammonium solution was performed on the photoresist pattern. A cleaning process using water was performed on the photoresist pattern. The removing rate of the photoresist pattern was measured. A thickness of a removed photoresist pattern was about 7,819 Å. The result may mean that the reaction time between the hydroxyl ion included in the ozone gas and the photoresist pattern is not sufficient.

EXAMPLE 2

A photoresist pattern was removed by a process substantially the same as that of Example 1 except for the reaction time. The ozone vapor and the photoresist pattern were reacted for about two minutes. A thickness of a removed photoresist pattern was about 16,132 Å. The result may mean that the reaction time between hydroxyl ion included in the ozone gas and the photoresist pattern is not sufficient.

EXAMPLE 3

A photoresist pattern was removed by a process substantially the same to that of Example 1 except for the reaction time. The ozone vapor and the photoresist pattern were reacted for about four minutes. A thickness of a removed photoresist pattern was about 17,988 Å. The result may mean that the reaction time between hydroxyl ion included in the ozone gas and the photoresist pattern is sufficient.

As a result of Examples 1 to 3, in order to remove a photoresist pattern having a thickness of about 20,000 Å, the ozone vapor may be required to be introduced onto the photoresist pattern for about four minutes or more.

Figure 12:
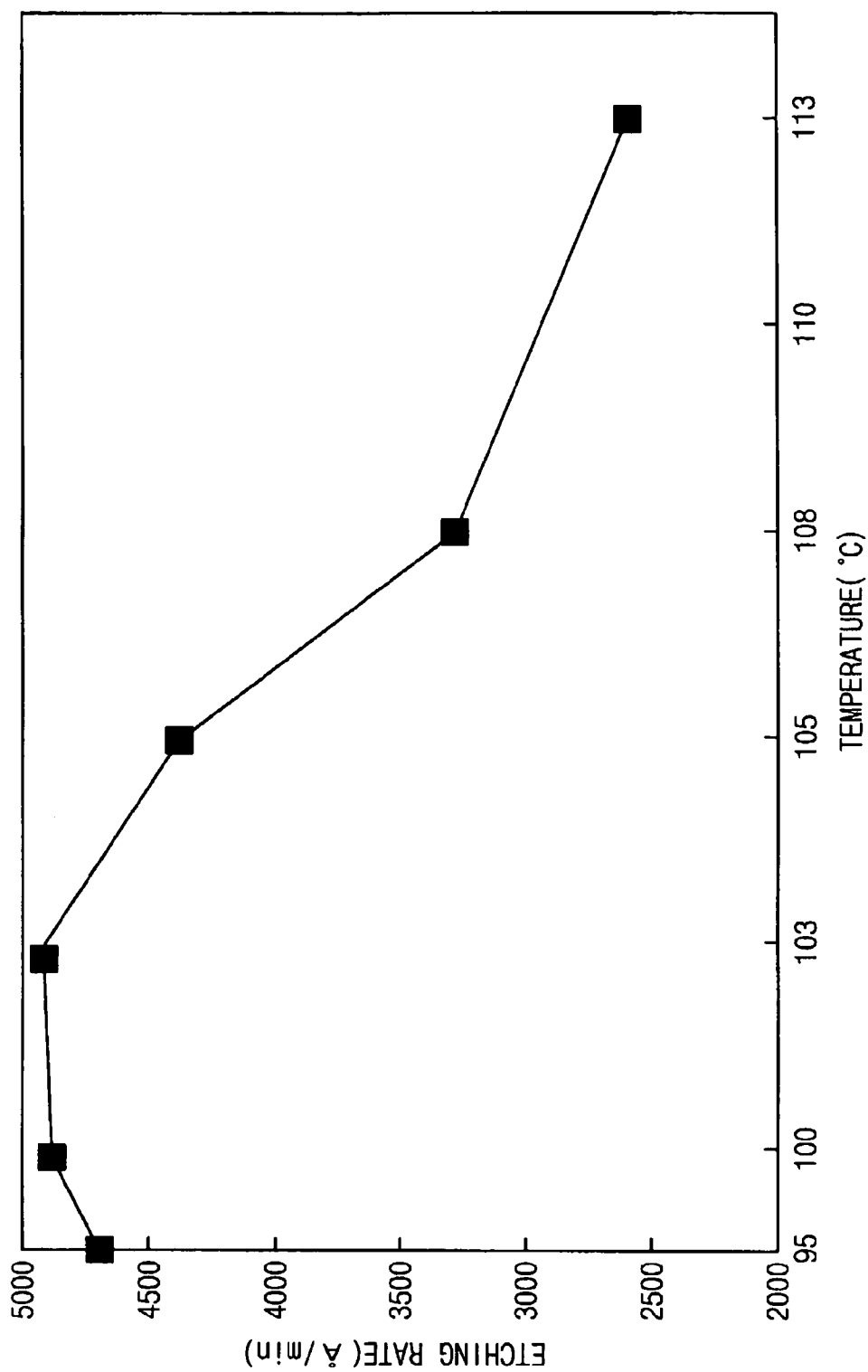

Evaluation of an Etching Rate of a Photoresist Pattern According to a Temperature of a Chamber FIG. 12 is a graph illustrating an etching rate of a photoresist pattern according to a temperature of a chamber in accordance with example embodiments of the present invention. A process for removing a photoresist pattern was performed in a chamber using an ozone gas and an alkali solution in accordance with example embodiments of the present invention. Referring to FIG. 12, when a temperature of the chamber is about 95° C., the photoresist pattern may be etched with an etching rate of about 4,750 Å/min. A pressure of the chamber may be about 75 kPa. When the temperature of the chamber is about 100° C., the photoresist pattern may be etched with an etching rate of about 4,950 Å/min. When the temperature of the chamber is about 103° C., the photoresist pattern may be etched with an etching rate of about 5,000 Å/min. When the temperature of the chamber is about 105° C., the photoresist pattern may be etched with an etching rate of about 4,500 Å/min. When the temperature of the chamber is about 108° C., the photoresist pattern may be etched with an etching rate of about 3,400 Å/min. The removal of the photoresist pattern may then be performed at a temperature of about 95° C. to about 108° C.

Figure 13:
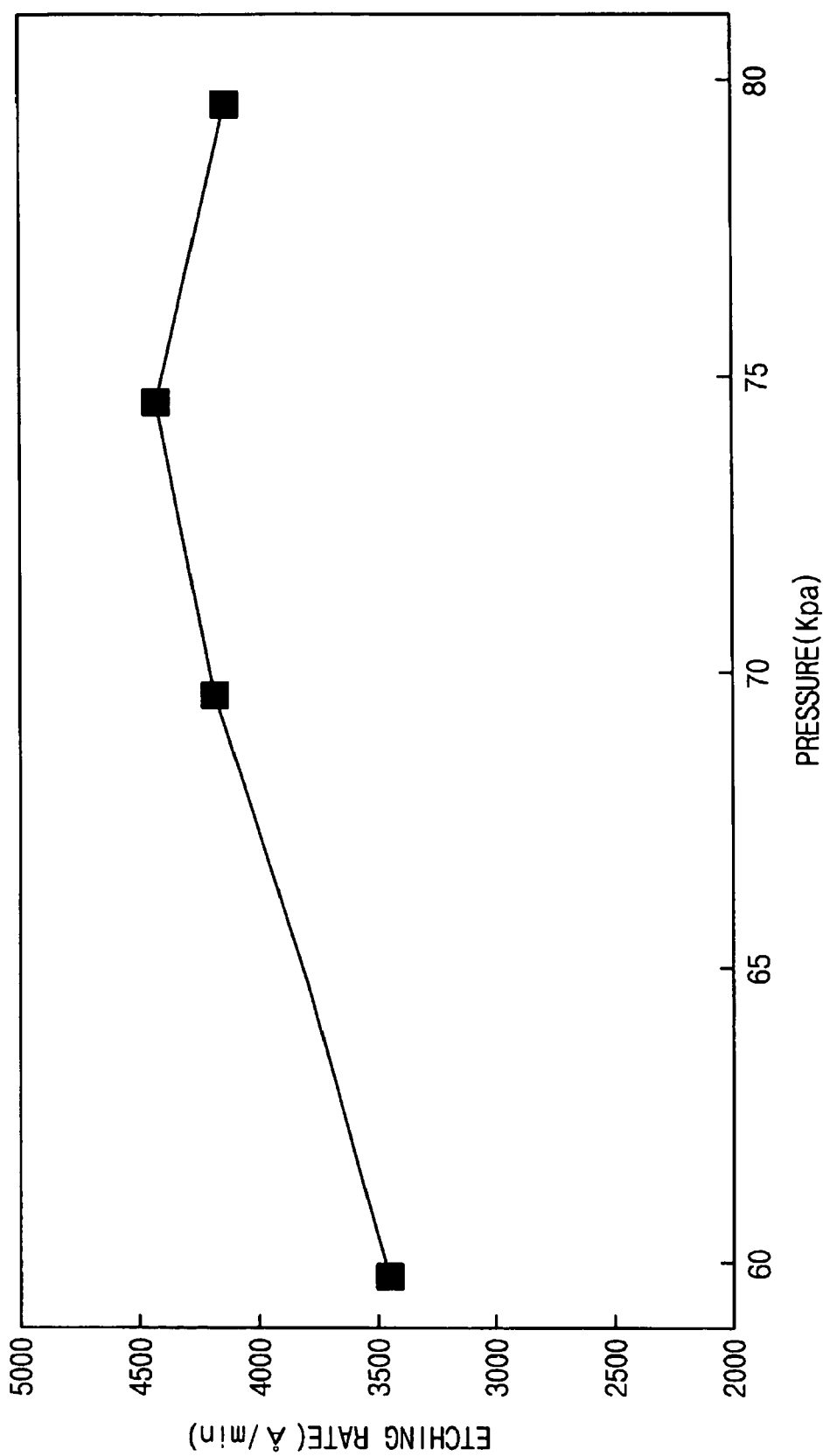

Evaluation of an Etching Rate of a Photoresist Pattern According to a Pressure of a Chamber FIG. 13 is a graph illustrating an etching rate of a photoresist pattern according to a pressure of a chamber in accordance with example embodiments of the present invention. A process for removing a photoresist pattern was performed in a chamber using an ozone gas and an alkali solution in accordance with example embodiments of the present invention. Referring to FIG. 13, when a pressure of the chamber is about 60 kPa, the photoresist pattern may be etched with an etching rate of about 3,500 Å/min and a temperature of the chamber may be about 105° C. When the pressure of the chamber is about 65 kPa, the photoresist pattern may be etched with an etching rate of about 3,700 Å/min. When the pressure of the chamber is about 70 kpa, the photoresist pattern may be etched with an etching rate of about 4,200 Å/min. When the pressure of the chamber is about 75 kPa, the photoresist pattern may be etched with an etching rate of about 4,400 Å/min. When the pressure of the chamber is about 80 kPa, the photoresist pattern may be etched with an etching rate of about 4,200 Å/min. The removal of the photoresist pattern may then be performed under a pressure of about 70 kPa to about 80 kPa.

Figure 14:
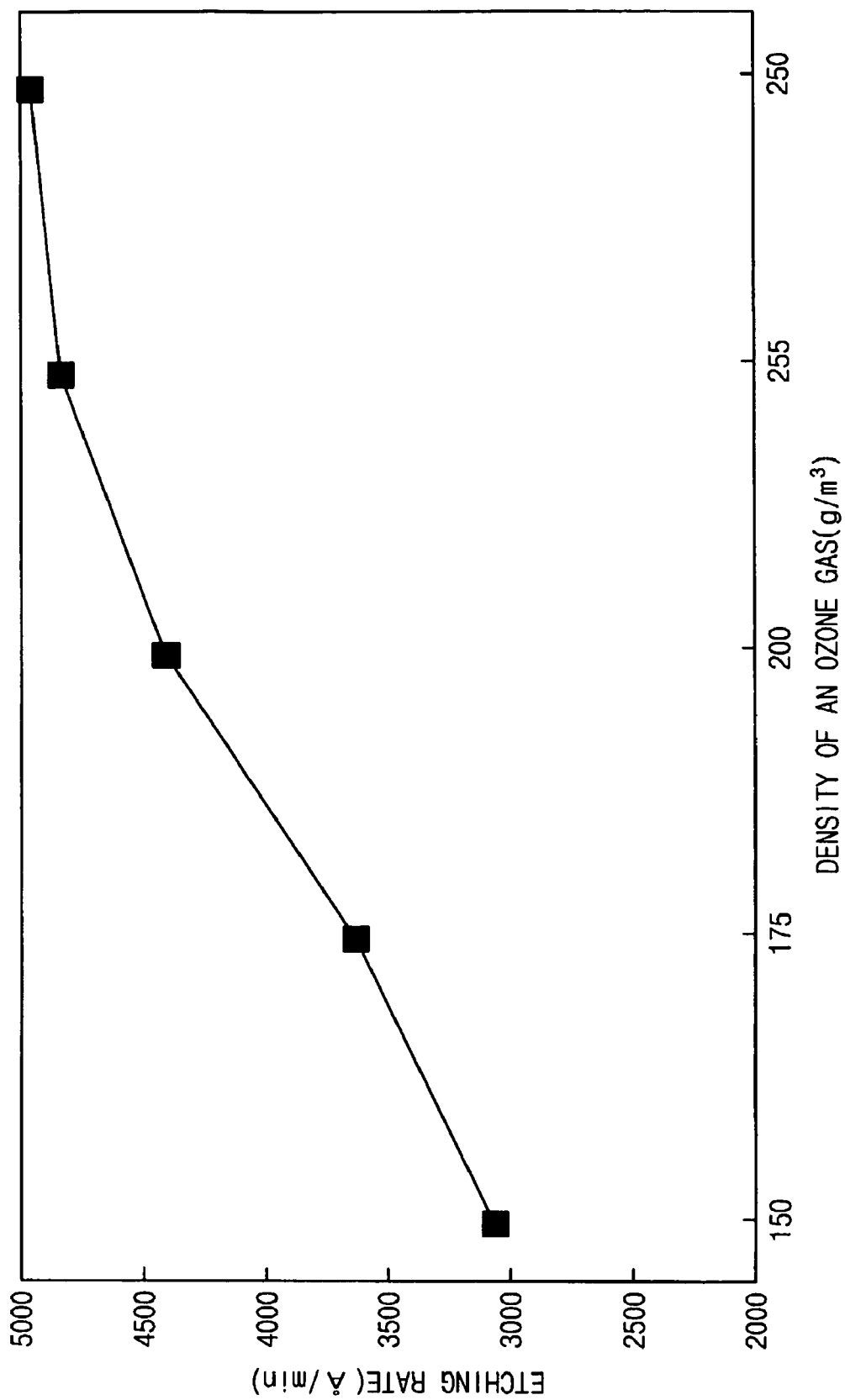
FIG. 14 is a graph illustrating an etching rate of a photoresist pattern relative to an ozone gas density in accordance with example embodiments of the present invention.

Evaluation of an Etching Rate of a Photoresist Pattern According to a Density of an Ozone Gas FIG. 14 is a graph illustrating an etching rate of a photoresist pattern relative to a density of an ozone gas in accordance with example embodiments of the present invention. A process for removing a photoresist pattern was performed in a chamber using an ozone gas and an alkali solution in accordance with example embodiments of the present invention. Referring to FIG. 14, when a density of an ozone gas is about 150 g/m$^3$, the photoresist pattern may be etched with an etching rate of about 3,100 Å/min. The conditions of the chamber may have a temperature of about 105° C. and a pressure of the chamber about 75 kPa. When a density of an ozone gas is about 175 g/m$^3$, the photoresist pattern may be etched with an etching rate of about 3,550 Å/min. When a density of an ozone gas is about 200 g/m$^3$, the photoresist pattern may be etched with an etching rate of about 4,450 Å/min. When a density of an ozone gas is about 225 g/m$^3$, the photoresist pattern may be etched with an etching rate of about 4,850 Å/min. When a density of an ozone gas is about 250 g/m$^3$, the photoresist pattern may be etched with an etching rate of about 5,000 Å/min. The removal of the photoresist pattern may then be performed using an ozone gas having a density of about 150 g/m$^3$ to about 250 g/m$^3$.

According to example embodiments of the present invention, a photoresist pattern may be soluble in water by treating a hydroxyl ion, which is generated by an ozone gas, a water vapor and a cleaning solution. Additional processes (e.g., a dissolving process) using excimer light may not be required. The photoresist pattern may be removed by cleaning with water. In a method of forming a pattern including removing the photoresist pattern according to example embodiments of the present invention, the photoresist pattern may be effectively removed without an increased processing time. A manufacturing process of a semiconductor device may then have an enhanced throughput.

The foregoing is illustrative of example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the example embodiments of the present invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of example embodiments of the present invention and is not to be construed as limited to the specific embodiments disclosed and that modifications to the disclosed embodiments, as well as other embodiments, are intended to be included within the scope of the appended claims. Example embodiments of the present invention are defined by the following claims, with equivalents of the claims to be included therein.

What is claimed is:

1. A method of treating a photoresist pattern comprising:
providing an ozone vapor including a water vapor and an ozone gas onto the photoresist pattern to remove a hydrophobic group from a photoresist resin included in the photoresist pattern; and
providing a cleaning solution including an acid or an alkali solution to make the photoresist pattern soluble in water.

2. The method of claim 1, wherein the photoresist resin includes an acrylate polymer or a methacrylate polymer including a carbon-carbon single bond.

3. The method of claim 1, wherein the ozone vapor includes a hydroxyl ion ($OH^-$).

4. The method of claim 1, further comprising:
performing a cleaning process using water on the photoresist pattern to remove the photoresist pattern.

5. The method of claim 3, wherein the hydrophobic group from the photoresist resin is removed by the hydroxyl ion generated from a reaction between the water vapor and the ozone gas.

6. The method of claim 1, wherein the ozone vapor has an ozone density of about 150 $g/m^3$ to about 250 $g/m^3$.

7. The method of claim 1, wherein providing the ozone vapor and providing the cleaning solution including the acid solution or the alkali solution are performed at a temperature of about 90° C. to about 120° C.

8. The method of claim 1, wherein providing the ozone vapor and providing the cleaning solution including the acid solution or the alkali solution are performed at a pressure of about 40 kPa to about 100 kPa.

9. The method of claim 3, wherein the photoresist pattern is made to be soluble in water by binding the hydroxyl ion and one of a hydrogen ion ($H^+$) and an alkali ion instead of the hydrophobic group in the photoresist resin.

10. The method of claim 1, further comprising:
forming the photoresist pattern, wherein forming the photoresist pattern includes:
forming a structure on a substrate;
adhering a photoresist composition for ArF on the structure to form a photoresist film;
performing a light-exposure process or a developing process on the photoresist film to form the photoresist pattern.

11. The method of claim 10, wherein the structure may include a metal layer, a metal oxide layer, a metal nitride layer, an oxide layer, a polysilicon layer and a barrier layer.

12. The method of claim 10, wherein an exposed portion of the structure is selectively etched using the photoresist pattern as an etching mask to form a structure pattern having an opening.

13. A method of treating a photoresist pattern comprising:
providing an ozone vapor including a water vapor and an ozone gas onto the photoresist pattern to remove a hydrophobic group from a photoresist resin included in the photoresist pattern;
providing an acid or an alkali solution to make the photoresist pattern soluble in water; and
performing a cleaning process using water on the photoresist pattern to remove the photoresist pattern.

14. A method of treating a photoresist pattern comprising:
removing a hydrophobic group from a photoresist resin included in the photoresist pattern by providing an ozone vapor including a water vapor and an ozone gas onto the photoresist pattern to form a positive ion-binding site in the photoresist resin included in the photoresist pattern; and
providing an acid or an alkali solution to make the photoresist pattern soluble in water,
wherein the acid solution or the alkali solution provide a positive ion including a hydrogen ion or an alkali ion binding the positive ion-binding site in the photoresist resin included in the photoresist pattern.

15. The method of claim 14, wherein the positive ion-binding site in the photoresist resin includes a carboxyl ion ($COO^-$) having a negative charge.

* * * * *